(12) United States Patent
Shindo et al.

(10) Patent No.: US 12,272,541 B2
(45) Date of Patent: Apr. 8, 2025

(54) ETCHING METHOD AND ETCHING APPARATUS

(71) Applicant: Tokyo Electron Limited, Tokyo (JP)

(72) Inventors: Naoki Shindo, Nirasaki (JP); Gen You, Nirasaki (JP); Haruna Suzuki, Tokyo (JP)

(73) Assignee: Tokyo Electron Limited, Tokyo (JP)

(*) Notice: Subject to any disclaimer, the term of this patent is extended or adjusted under 35 U.S.C. 154(b) by 303 days.

(21) Appl. No.: 17/664,932

(22) Filed: May 25, 2022

(65) Prior Publication Data

US 2022/0384178 A1 Dec. 1, 2022

(30) Foreign Application Priority Data

May 28, 2021 (JP) .................. 2021-089934

(51) Int. Cl.
*H01L 21/02* (2006.01)
*H01L 21/311* (2006.01)
*H01L 21/67* (2006.01)
*H01L 21/687* (2006.01)

(52) U.S. Cl.
CPC .. *H01L 21/02019* (2013.01); *H01L 21/31116* (2013.01); *H01L 21/67063* (2013.01); *H01L 21/68714* (2013.01)

(58) Field of Classification Search
CPC ......... H01L 21/02019; H01L 21/31116; H01L 21/67063; H01L 21/68714; H01L 21/32135; H01L 21/67103; H01L 21/67248; H01L 21/67069; C23F 1/12
See application file for complete search history.

(56) References Cited

U.S. PATENT DOCUMENTS

| | | | | |
|---|---|---|---|---|
| 5,616,208 A | * | 4/1997 | Lee | H01L 21/67017 134/1.1 |
| 6,001,742 A | * | 12/1999 | Chang | H01L 21/32135 438/723 |
| 6,454,909 B1 | * | 9/2002 | Matsuse | C23C 16/481 204/192.12 |
| 9,275,834 B1 | * | 3/2016 | Park | H01J 37/32366 |
| 2002/0190024 A1 | * | 12/2002 | Eguchi | C23C 16/4405 118/724 |
| 2015/0155177 A1 | * | 6/2015 | Zhang | H01J 37/32357 438/719 |

(Continued)

FOREIGN PATENT DOCUMENTS

| | | | | |
|---|---|---|---|---|
| EP | 1619268 A2 | * | 1/2006 | ......... C23C 16/4405 |
| JP | 4408124 B2 | | 2/2010 | |

OTHER PUBLICATIONS

Bing, EP-1619268-A2, Machine Translation. (Year: 2024).*

*Primary Examiner* — Duy Vu N Deo
*Assistant Examiner* — Christopher Remavege
(74) *Attorney, Agent, or Firm* — Armstrong Teasdale LLP

(57) ABSTRACT

An etching method includes preparing a substrate in which titanium nitride and molybdenum or tungsten are present, and etching the titanium nitride by supplying a processing gas including a $ClF_3$ gas and a $N_2$ gas to the substrate, wherein in the etching the titanium nitride, a partial pressure ratio of the $ClF_3$ gas to the $N_2$ gas in the processing gas is set to a value at which grain boundaries of the molybdenum or the tungsten are nitrided to such an extent that generation of a pitting is suppressed.

20 Claims, 11 Drawing Sheets

(56) References Cited

U.S. PATENT DOCUMENTS

| 2016/0064219 | A1* | 3/2016 | Yamamoto | H01J 37/32449 118/725 |
|---|---|---|---|---|
| 2020/0118824 | A1* | 4/2020 | Okada | H01L 21/76879 |
| 2021/0305071 | A1* | 9/2021 | Wang | H01L 21/67069 |

* cited by examiner

Case A

Case B

Case C

Case D

ETCHING METHOD AND ETCHING APPARATUS

CROSS-REFERENCE TO RELATED APPLICATION

This application is based upon and claims the benefit of priority from Japanese Patent Application No. 2021-089934, filed on May 28, 2021, the entire contents of which are incorporated herein by reference.

TECHNICAL FIELD

The present disclosure relates to an etching method and an etching apparatus.

BACKGROUND

In a metal film forming process, a TiN film or a Ti film may be used as a barrier metal of a metal film. After processing the metal film into a desired shape, a process of etching and removing the TiN film or the Ti film is performed. In the related art, wet etching is often used. Further, there is a structure in which only the TiN film cannot be removed by the wet etching. It has been studied to etch the TiN film by a dry process. Patent document 1 discloses a technique for removing TiN using a $ClF_3$ gas, which is an example of dry cleaning.

PRIOR ART DOCUMENT

Patent Document

Patent Document 1: Japanese Patent No. 4408124

SUMMARY

According to one embodiment of the present disclosure, there is provided an etching method includes preparing a substrate in which titanium nitride and molybdenum or tungsten are present, and etching the titanium nitride by supplying a processing gas including a $ClF_3$ gas and a $N_2$ gas to the substrate, wherein in the etching the titanium nitride, a partial pressure ratio of the $ClF_3$ gas to the $N_2$ gas in the processing gas is set to a value at which grain boundaries of the molybdenum or the tungsten are nitrided to such an extent that generation of a pitting is suppressed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments will be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Etching Method

First Embodiment

Figure 1:
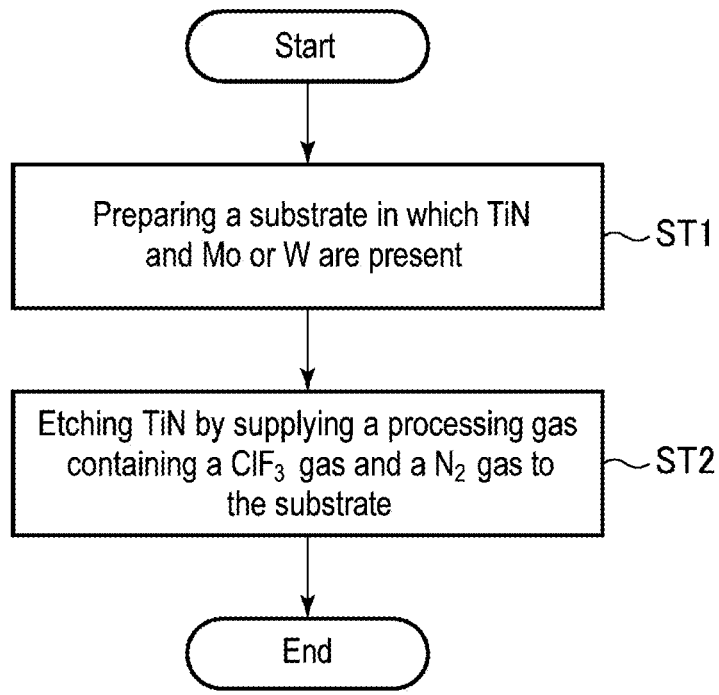
FIG. 1 is a flowchart showing an etching method according to a first embodiment.

FIG. 1 is a flowchart showing an etching method according to a first embodiment.

In the present embodiment, first, a substrate on which titanium nitride (TiN) and molybdenum (Mo) or tungsten (W) exist is prepared (step ST1). Subsequently, a processing gas including a chlorine trifluoride gas ($ClF_3$ gas) and a nitrogen gas ($N_2$ gas) is supplied to the substrate to etch TiN (step ST2).

This will be described in detail below.

The substrate prepared in step ST1 includes TiN and Mo or W which are arranged so as to be in contact with the processing gas during the etching process. The substrate is not particularly limited as long as it has such a structure. A semiconductor wafer is exemplified as the substrate. TiN to be etched is used as a barrier film for Mo or W.

Figure 2:
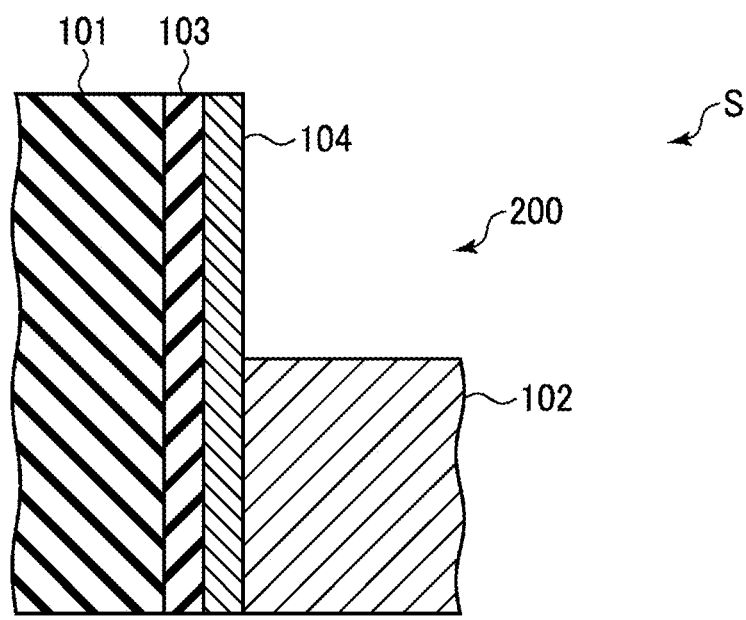
FIG. 2 is a cross-sectional view showing an example of a substrate to which the etching method according to the first embodiment is applicable.
Figure 3:
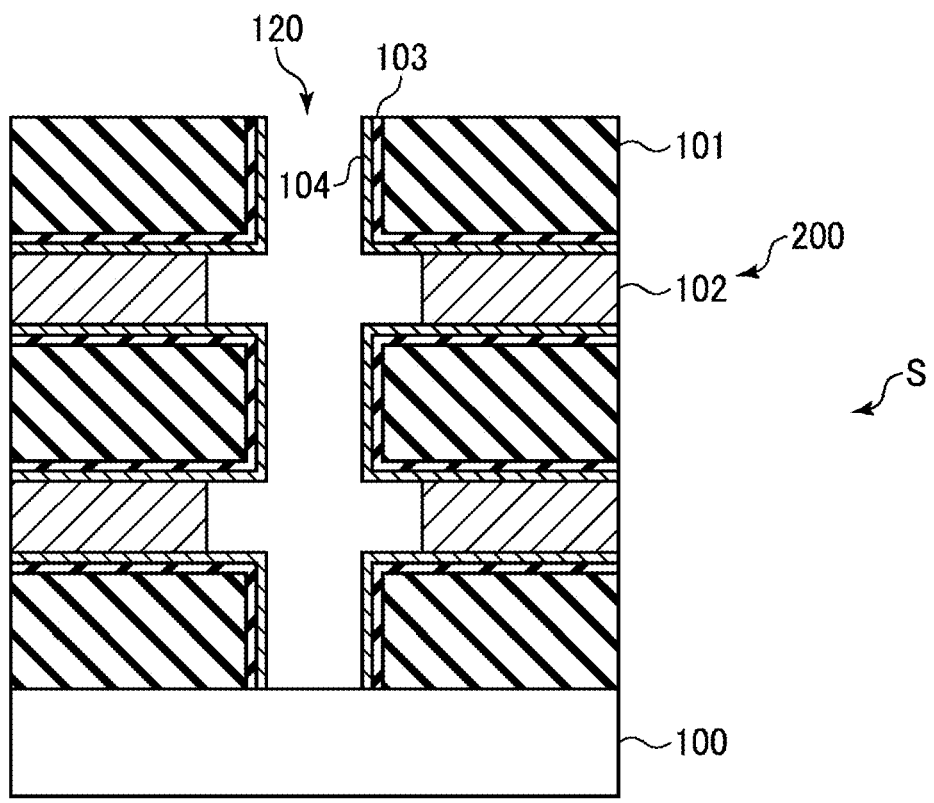
FIG. 3 is a cross-sectional view showing a specific example of a structure of the substrate shown in FIG. 2.

FIG. 2 is a cross-sectional view showing an example of a substrate to which the etching method of the first embodiment is applicable. The substrate S of FIG. 2 is configured by forming a structure 200 on a semiconductor substrate (not shown in FIG. 2) such as silicon or the like. The structure 200 includes a $SiO_2$ film 101 and a Mo film 102. An $Al_2O_3$ film 103, which is an insulating barrier, and a TiN film 104, which is a barrier, are sequentially formed on the surface of the $SiO_2$ film 101. The Mo film 102 is in a state of being etched halfway. As such a structure 200, there is exemplified a 3D structure in which, as shown in FIG. 3, the $SiO_2$ film 101 and the Mo film 102 are alternately laminated on a semiconductor substrate 100 in a state that the Mo film 102 is recess-etched through a groove (slit) 120. In the structure 200 of FIGS. 2 and 3, natural oxide films ($MoO_x$ and TiON) are formed on the surfaces of the Mo film 102 and the TiN film 104.

Figure 4:
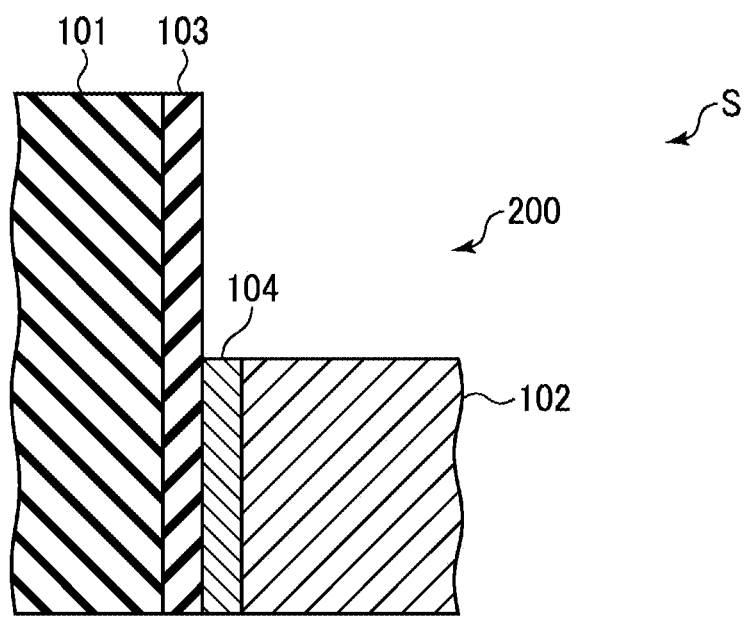
FIG. 4 is a cross-sectional view showing a state after etching a TiN film of the substrate shown in FIG. 2.
Figure 5:
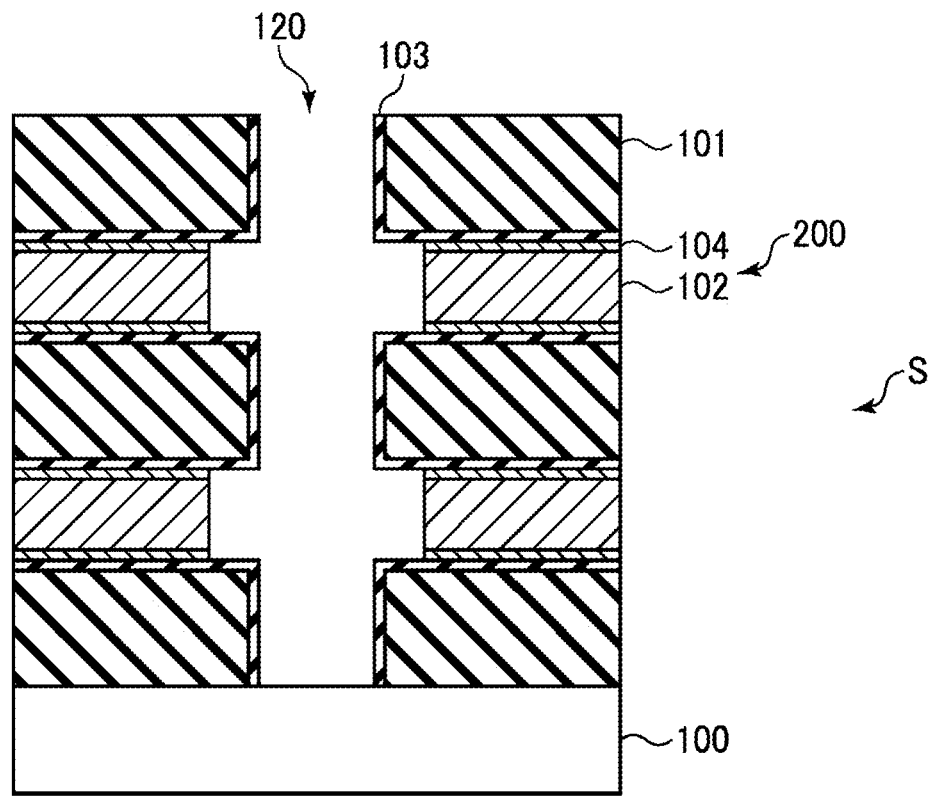
FIG. 5 is a cross-sectional view showing a state after etching the TiN film of the substrate shown in FIG. 3.

In step ST2, a processing gas including a $ClF_3$ gas, which is an etching gas, and a $N_2$ gas is supplied to the substrate having TiN and Mo or W to etch TiN. For example, in the structure 200 after etching the Mo film 102 shown in FIGS. 2 and 3, an exposed TiN film 104 is etched to obtain states shown in FIGS. 4 and 5.

In step ST2, the processing gas may include other gases such as an argon gas (Ar gas) or the like in addition to the $ClF_3$ gas and the $N_2$ gas. In the present embodiment, a partial pressure ratio of the $ClF_3$ gas to the $N_2$ gas in the processing gas is set to a value at which grain boundaries of Mo or W are nitrided to such an extent that the generation of a pitting is suppressed.

This point will be described below.

Figure 6:
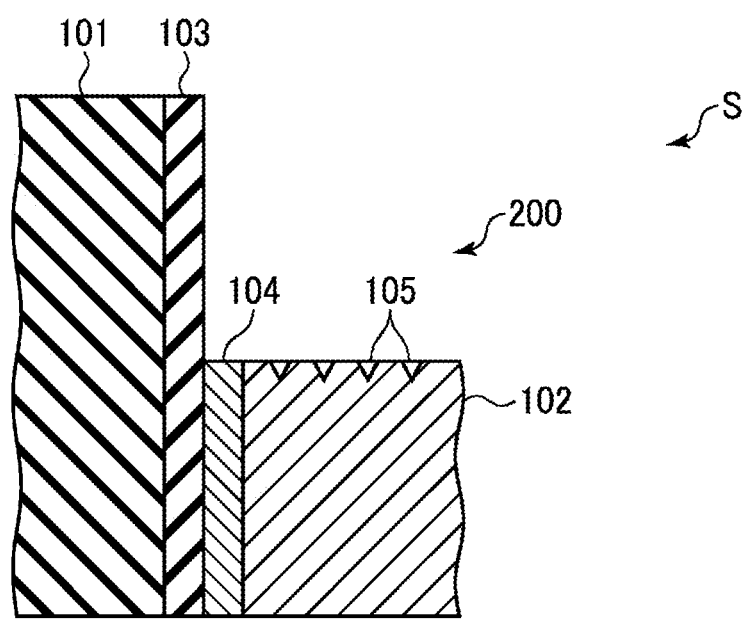
FIG. 6 is a cross-sectional view showing a state in which a pitting is generated on a surface of a Mo film when an exposed portion of the TiN film shown in FIG. 2 is removed by etching.

When etching TiN with the processing gas including the $ClF_3$ gas and the $N_2$ gas, if an attempt is made to completely remove TiN by breaking hard TiON, which is an oxide film existing on the surface of TiN, it was found that a pitting may be generated on Mo or W. For example, when the exposed portion of the TiN film 104 shown in FIG. 2 is completely removed by etching, a pitting 105 may be generated on the surface of the Mo film 102 as shown in FIG. 6. The Mo film 102 is a polycrystal. The polycrystal generally has a lower etching resistance and a higher etching rate at the grain boundaries than the crystal grains themselves. Therefore, it is presumed that the pitting is generated by the following two mechanisms.

Figure 7A:
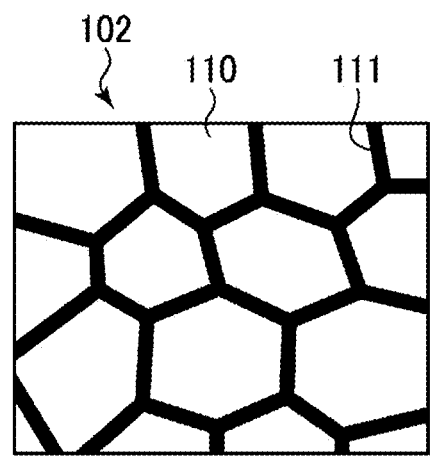
FIGS. 7A, 7B, and 7C are diagrams for explaining a first mechanism when a pitting is generated in the Mo film when etching the TiN film.
Figure 7B:
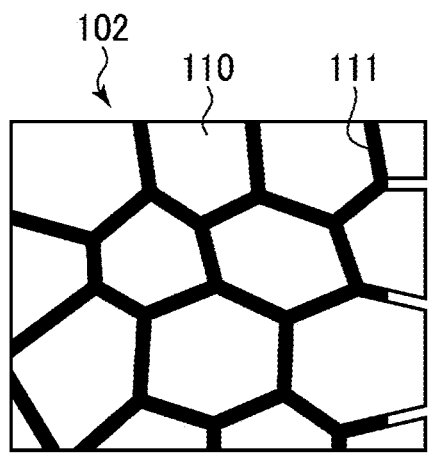
Figure 7C:
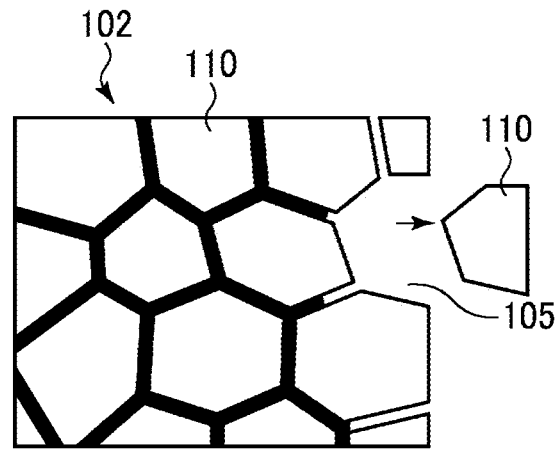
Figure 8A:
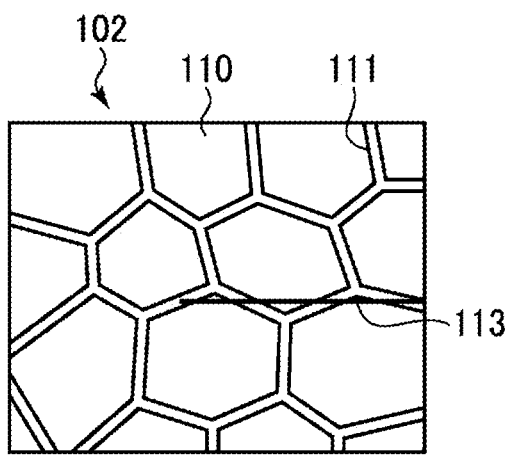
FIGS. 8A, 8B, and 8C are diagrams for explaining a second mechanism when a pitting is generated in the Mo film when etching the TiN film.
Figure 8B:
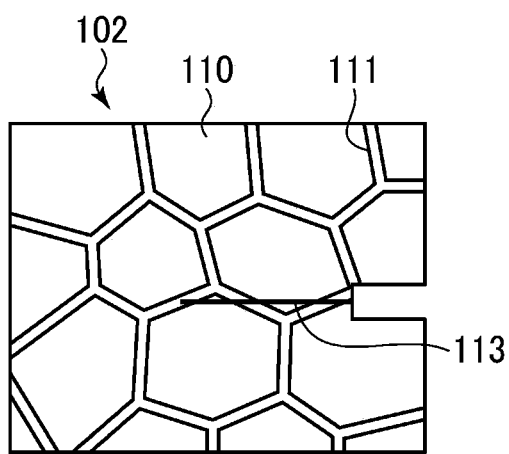
Figure 8C:
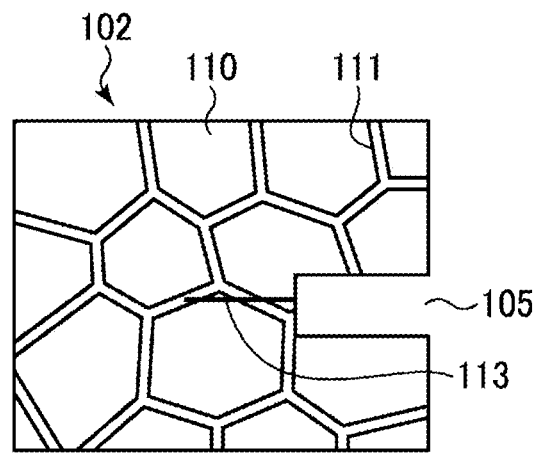

A first mechanism is shown in FIGS. 7A, 7B and 7C. As shown in FIG. 7A, the Mo film 102 has crystal grain boundaries 111 between crystal grains 110. As the etching progresses, the crystal grain boundaries 111 are preferentially etched as shown in FIG. 7B. As the etching further progresses, the crystal grain 110 is lifted off to generate the pitting 105 as shown in FIG. 7C. A second mechanism is as shown in FIGS. 8A, 8B and 8C. As shown in FIG. 8A, when a seam portion 113 is formed along the crystal grain boundaries 111, as the etching progresses, the etching proceeds along the seam portion 113, and when the etching further progresses, the pitting 105 is generated as shown in FIG. 8C. In practice, it is presumed that the pitting is generated by the combination of these two mechanisms.

In the present embodiment, in order to suppress the generation of such a pitting, the partial pressure ratio of the $ClF_3$ gas to the $N_2$ gas in the processing gas is lowered (that is, the $ClF_3$ gas is reduced and the $N_2$ gas is increased), and the grain boundaries of Mo or W are nitrided. That is, the partial pressure ratio of the $ClF_3$ gas to the $N_2$ gas in the processing gas is set to a value at which the grain boundaries of Mo or W are nitrided to such an extent that the generation of a pitting is suppressed. By nitriding the grain boundaries, the etching by the $ClF_3$ gas is suppressed, and the generation of a pitting due to the etching of the crystal grain boundaries is suppressed.

In order to exert the pitting suppressing effect by increasing the etching resistance of the crystal grain boundaries, the partial pressure ratio ($ClF_3/N_2$) of the $ClF_3$ gas to the $N_2$ gas in the processing gas is preferably set to 0.026 or less. By increasing the ratio of the $N_2$ gas to the $ClF_3$ gas by setting the $ClF_3/N_2$ to 0.026 or less, the nitriding of the grain boundaries of Mo or W is promoted. This makes it possible to effectively suppress the etching of the grain boundaries and to suppress the generation of a pitting.

For the etching of TiN in step ST2, it is preferable that the temperature of the substrate is in the range of 20 to 180 degrees C. and an internal pressure of the chamber is in the range of 0.25 to 2 Torr (33.3 to 267 Pa).

In the related art, wet etching has been the mainstream for etching TiN. However, depending on the structure of the substrate, wet etching alone may not be sufficient. For example, as shown in FIGS. 2 and 3, in the case of a substrate S having a structure in which an $Al_2O_3$ film 103 and a TiN film 104 exist, if the TiN film 104 is to be removed by wet etching, the $Al_2O_3$ film may also be etched. Although it is known that TiN could be dry-etched with a $ClF_3$ gas, it was found that a pitting is generated in the coexisting Mo and W as described above.

On the other hand, in the present embodiment, the processing gas used at the time of etching is set to include the $ClF_3$ gas and the $N_2$ gas, and the partial pressure of the $N_2$ gas is increased so that the partial pressure ratio of the $ClF_3$ gas to the $N_2$ gas has a value at which the grain boundaries of Mo or W are nitrided to such an extent that the generation of a pitting is suppressed. As a result, TiN can be removed by etching without residue while suppressing the generation of a pitting in Mo or W.

Second Embodiment

Figure 9:
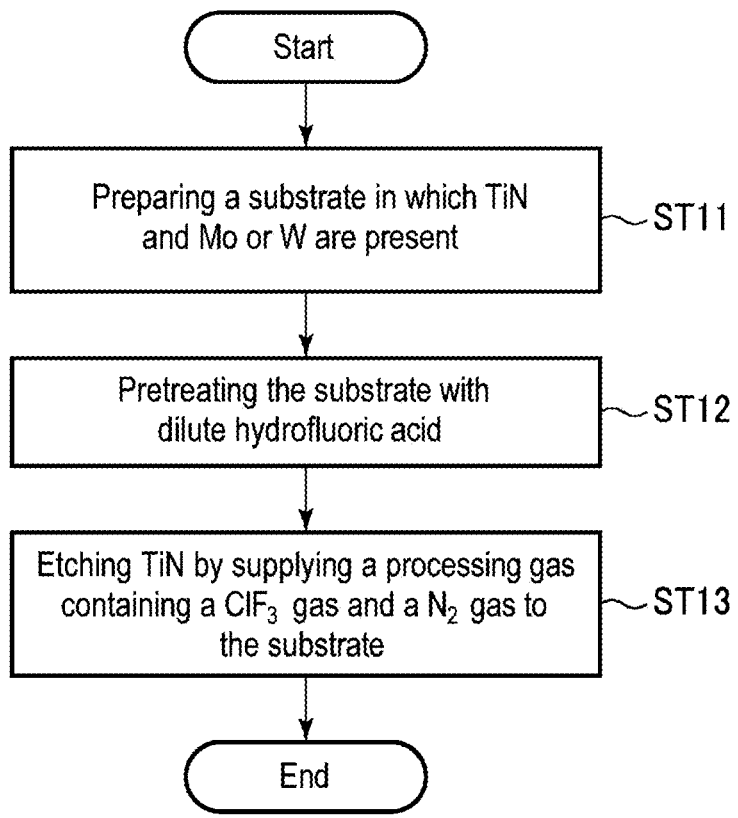
FIG. 9 is a flowchart showing an etching method according to a second embodiment.

FIG. 9 is a flowchart showing an etching method according to a second embodiment.

In the present embodiment, first, as in step ST1 of the first embodiment, a substrate in which TiN and Mo or W are present is prepared (step ST11). Subsequently, the substrate is pretreated with dilute hydrofluoric acid (DHF) (step ST12). Subsequently, as in step ST2 of the first embodiment, a processing gas including a $ClF_3$ gas and a $N_2$ gas is supplied to the substrate to etch TiN (step ST13).

Hereinafter, a specific description will be given.

As in the first embodiment, the substrate prepared in step ST11 includes TiN and Mo or W which are arranged so as to be in contact with the processing gas during the etching process. The substrate is not particularly limited as long as it has such a structure. A semiconductor wafer is exemplified as the substrate. TiN to be etched is used as a barrier film for Mo or W. As for a specific example of the substrate, the structure shown in FIGS. 2 and 3 may be adopted as in the first embodiment.

In step ST12, a natural oxide film (TiON) on the surface of TiN is mainly removed by DHF. At this time, a portion of the surface of Mo, which includes the natural oxide film ($MoO_x$), is also removed. By performing the pretreatment with DHF in this way, it is possible to suppress variations in an incubation time of the etching process using the processing gas in the subsequent step ST13 and to stabilize the process.

Figure 10:
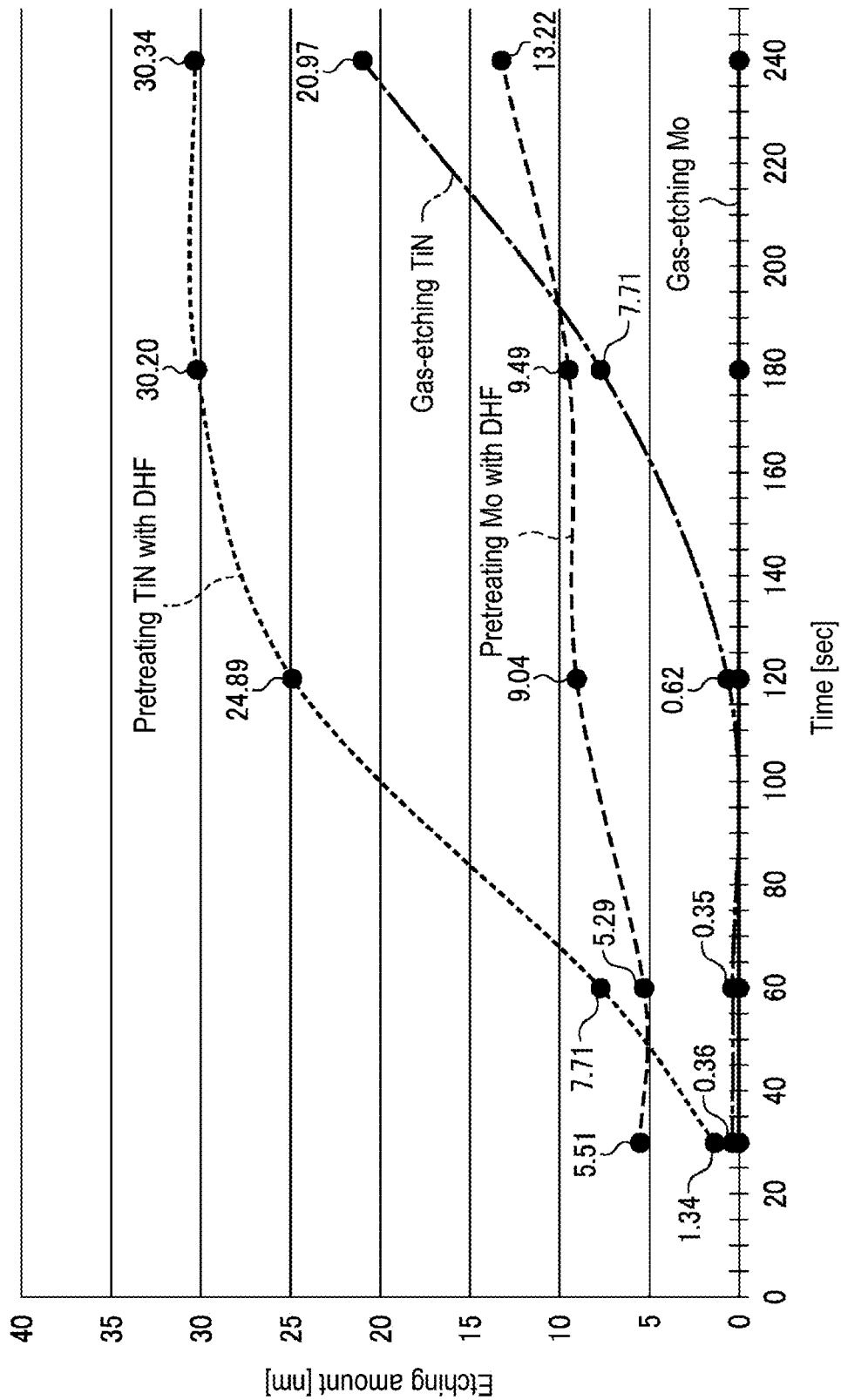
FIG. 10 is a diagram showing etching amounts of TiN and Mo when etching is performed with a processing gas including a $ClF_3$ gas and a $N_2$ gas after DHF pretreatment and when the etching is performed with the processing gas without the DHF pretreatment.

FIG. 10 is a diagram showing etching amounts of TiN and Mo when etching is performed with a processing gas including a $ClF_3$ gas and an $N_2$ gas after DHF pretreatment and when etching is performed with the processing gas without DHF pretreatment. As shown in this figure, it can be seen that the incubation time of TiN etching is long when only the etching with the processing gas is performed, but the etching progresses without the incubation time when the DHF pretreatment is performed. Further, it was confirmed that the etching of Mo also progresses in the DHF pretreatment, but the smoothness is maintained without generating a pitting if the DHF pretreatment is performed in a short period of time of 60 sec. From this, it can be seen that by performing the DHF pretreatment, the instability of the process due to the variations in the incubation time can be eliminated, and the effect of process stabilization can be obtained.

In step ST13, as in step ST2 of the first embodiment, a processing gas including a $ClF_3$ gas and a $N_2$ gas is supplied to a substrate having TiN and Mo or W to etch TiN. Preferred conditions at this time are the same as in step ST2 of the first embodiment. That is, the partial pressure of the $N_2$ gas is increased so that the partial pressure ratio of the $ClF_3$ gas to the $N_2$ gas in the processing gas has a value at which the grain boundaries of Mo or W are nitrided to such an extent that the generation of a pitting is suppressed. At this time, the partial pressure ratio ($ClF_3/N_2$) of the $ClF_3$ gas to the $N_2$ gas in the processing gas is preferably set to 0.026 or less. For the etching of TiN in step ST13, as in step ST2 of the first embodiment, it is preferable that the temperature of the substrate is in the range of 20 to 180 degrees C. and the internal pressure of the chamber is in the range of 0.25 to 2 Torr (33.3 to 267 Pa).

<Example of Etching Apparatus>

Figure 11:
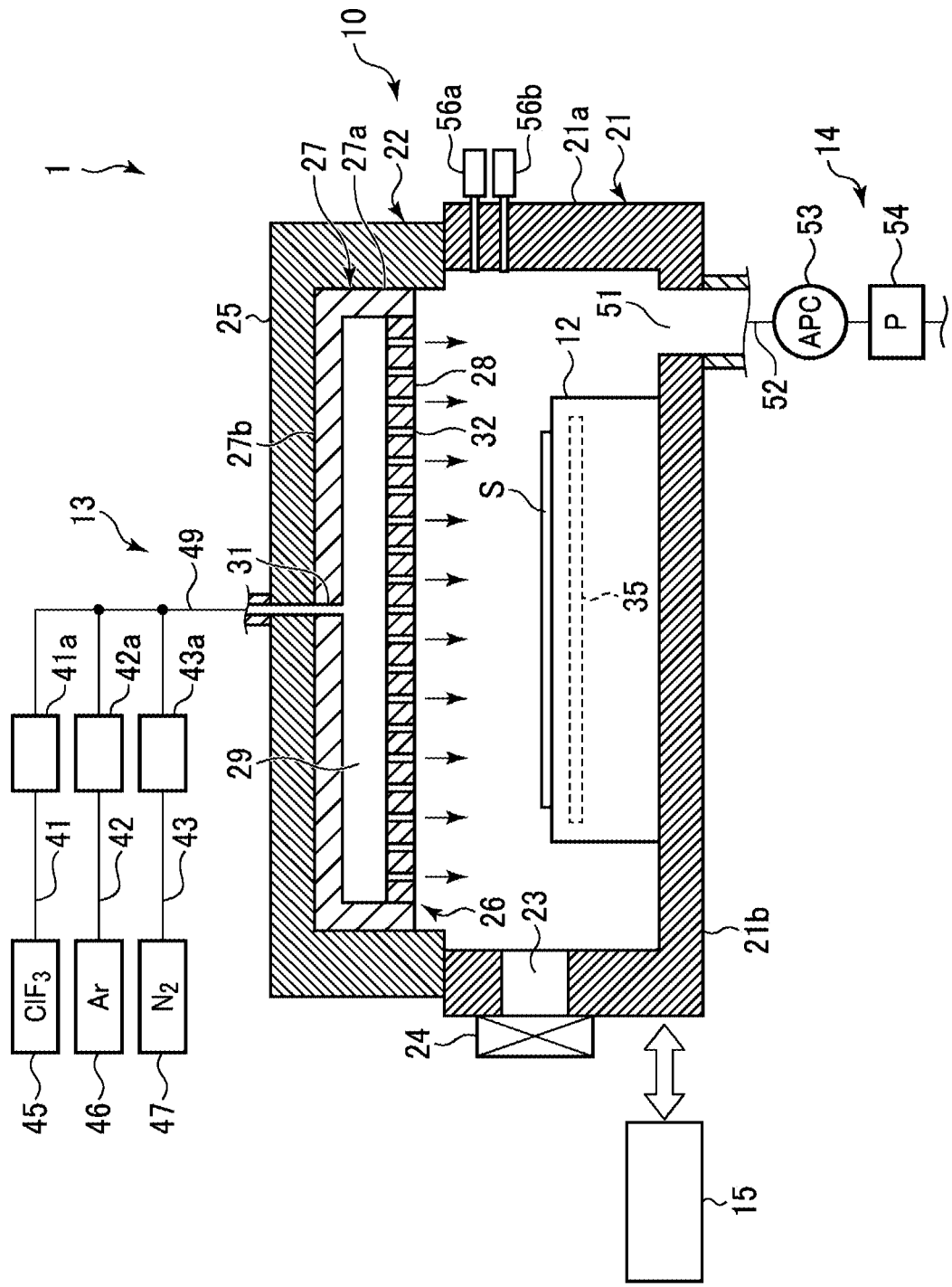
FIG. 11 is a cross-sectional view showing an etching apparatus for carrying out the etching method according to the embodiment.

Next, an example of an etching apparatus for carrying out the etching method according to the embodiment will be described. FIG. 11 is a cross-sectional view showing the example of the etching apparatus.

As shown in FIG. 11, an etching apparatus 1 includes a chamber 10 having a hermetically sealed structure. Inside the chamber 10, a stage 12 on which a substrate S is mounted in a horizontal state is provided. The substrate S has TiN and Mo or W, and has, for example, a structure shown in FIGS. 2 and 3. Further, the etching apparatus 1 includes a gas supply mechanism 13 for supplying an etching gas to the chamber 10, an exhaust mechanism 14 for evacuating the interior of the chamber 10, and a controller 15.

The chamber 10 includes a chamber body 21 and a lid portion 22. The chamber body 21 includes a substantially cylindrical sidewall portion 21a and a bottom portion 21b. An upper portion of the chamber 10 is an opening which is closed by the lid portion 22. The sidewall portion 21a and the lid portion 22 are sealed by a sealing member (not shown) to ensure airtightness in the chamber 10.

The lid portion 22 includes a lid member 25 constituting an outer portion, and a shower head 26 fitted inward of the lid member 25 and provided so as to face the stage 12. The shower head 26 is provided with a main body 27 including a cylindrical sidewall 27a and an upper wall 27b, and a shower plate 28 provided at the bottom of the main body 27. A space 29 is formed between the main body 27 and the shower plate 28.

A gas introduction path 31 is formed in the lid member 25 and the upper wall 27b of the main body 27 to extend to the space 29. A pipe 49 of a gas supply mechanism 13, which will be described later, is connected to the gas introduction path 31.

A plurality of gas discharge holes 32 is formed in the shower plate 28. The gas introduced into the space 29 via the pipe 49 and the gas introduction path 31 is discharged from the gas discharge holes 32 into the space inside the chamber 10.

The sidewall portion 21a is provided with a loading/unloading port 23 through which the substrate S is loaded and unloaded. The loading/unloading port 23 may be opened and closed by a gate valve 24.

The stage 12 has a substantially circular shape in a plan view and is fixed to the bottom portion 21b of the chamber 10. Inside the stage 12, there is provided a temperature controller 35 that adjusts a temperature of the stage 12 and controls a temperature of the substrate S placed on the stage 12. The temperature controller 35 includes, for example, a heater for heating the stage 12 and a conduit through which a temperature control medium (e.g., water or the like) circulates. An output of the heater and a flow rate of the temperature control medium are controlled by a controller (not shown) to control the temperature of the substrate S on the stage 12. A temperature sensor (not shown) for detecting the temperature of the substrate S is provided in the vicinity of the substrate S placed on the stage 12.

The gas supply mechanism 13 supplies a processing gas including a $ClF_3$ gas, which is an etching gas, and a $N_2$ gas. The gas supply mechanism 13 includes a $ClF_3$ gas source 45 for supplying a $ClF_3$ gas, an Ar gas source 46 for supplying an Ar gas, and a $N_2$ gas source 47 for supplying the $N_2$ gas. One ends of a $ClF_3$ gas supply pipe 41, an Ar gas supply pipe 42, and a $N_2$ gas supply pipe 43 are connected to the $ClF_3$ gas source 45, the Ar gas source 46, and the $N_2$ gas source 47, respectively. The other ends of the $ClF_3$ gas supply pipe 41, the Ar gas supply pipe 42, and the $N_2$ gas supply pipe 43 are connected to a common pipe 49 which is connected to the gas introduction path 31 described above. The $ClF_3$ gas supply pipe 41, the Ar gas supply pipe 42, and the $N_2$ gas supply pipe 43 are provided with flow rate controllers 41a, 42a, and 43a for opening and closing the flow paths and controlling the flow rates, respectively. Each of the flow rate controllers 41a, 42a, and 43a includes, for example, an on-off valve and a flow rate controller such as a mass flow controller or the like.

Therefore, the $ClF_3$ gas, the Ar gas, and the $N_2$ gas, which are inert gases, are supplied from the gas sources 45, 46, and 47 into the shower head 26 via the pipes 41, 42, 43, and 49, and are discharged into the chamber 10 from the gas discharge holes 32 of the shower plate 28.

The exhaust mechanism 14 includes an exhaust pipe 52 connected to an exhaust port 51 formed at the bottom portion 21b of the chamber 10. The exhaust mechanism 14 further includes an automatic pressure control valve (APC) 53 provided in the exhaust pipe 52 to control the internal pressure of the chamber 10, and a vacuum pump 54 for evacuating the interior of the chamber 10.

Two capacitance manometers 56a and 56b, one for high pressure and the other for low pressure, are provided on the sidewall of the chamber 10 as pressure gauges for measuring the internal pressure of the chamber 10 so as to be inserted into the chamber 10. An opening degree of the automatic pressure control valve (APC) 53 is adjusted and the internal pressure of the chamber 10 is controlled, based on values detected by the capacitance manometers 56a and 56b.

The controller 15 is typically composed of a computer and includes a main controller provided with a CPU that controls each component part of the etching apparatus 1. The controller 15 further includes an input device (keyboard, mouse, etc.), an output device (printer, etc.), a display device (display, etc.), and a memory device (storage medium), which are connected to the main controller. The main controller of the controller 15 controls the operation of the etching apparatus 1 based on, for example, a process recipe stored in a storage medium built in the memory device or a storage medium set in the memory device.

In the etching apparatus 1 configured as above, the substrate S is loaded into the chamber 10 and placed on the stage 12. The temperature of the stage 12 is controlled by the temperature controller 35, and the temperature of the substrate S is controlled by the stage 12 to a predetermined temperature in the range of, for example, 20 to 180 degrees C. Then, while the Ar gas and/or the $N_2$ gas are supplied into the chamber 10, the internal pressure of the chamber 10 is controlled to a predetermined pressure in the range of, for example, 0.25 to 2 Torr (33.3 to 267 Pa).

Then, when the temperature of the substrate S and the internal pressure of the chamber 10 are stable, the $ClF_3$ gas, which is an etching gas, is supplied into the chamber 10. At this time, the partial pressure ratio of the $ClF_3$ gas to the $N_2$ gas in the processing gas is set to a value at which the grain boundaries of Mo or W are nitrided to such an extent that the generation of a pitting is suppressed. The partial pressure ratio ($ClF_3/N_2$) of the $ClF_3$ gas and the $N_2$ gas in the processing gas may be set to 0.026 or less.

By supplying the processing gas in this way, TiN can be etched while suppressing the generation of a pitting of Mo or W.

After the etching is completed, the interior of the chamber 10 is purged with the Ar gas and/or the $N_2$ gas, and then the substrate S is unloaded from the chamber 10.

EXPERIMENTAL EXAMPLE

Next, experimental examples will be described.

Experimental Example 1

First, an experiment was conducted to check a relationship between the partial pressure ratio ($ClF_3/N_2$) of the $ClF_3$ gas and the $N_2$ gas in the processing gas and the pitting.

In this experiment, in practice, after a substrate on which a TiN film and a Mo film are formed is subjected to DHF treatment, etching was performed by the etching apparatus shown in FIG. 11 while changing the partial pressure ratio ($ClF_3/N_2$) of the $ClF_3$ gas to the $N_2$ gas. Specifically, the temperature of the substrate was set to 80 to 100 degrees C., the internal pressure of the chamber was set to 0.25 to 2 Torr (33.3 to 267 Pa), and the flow rates of the $ClF_3$ gas and the $N_2$ gas were changed as in cases A to D below. In Case A, the flow rate of the $ClF_3$ gas was set to 20 sccm and the flow rate of the $N_2$ gas was set to 390 sccm. The partial pressure ratio ($ClF_3/N_2$) at this time was 0.0512. In Case B, the flow rate of the $ClF_3$ gas was set to 20 sccm and the flow rate of the $N_2$ gas was set to 790 sccm. The partial pressure ratio ($ClF_3/N_2$) at this time was 0.0253. In case C, the flow rate of the $ClF_3$ gas was set to 23 sccm and the flow rate of the $N_2$ gas was set to 1,187 sccm. The partial pressure ratio ($ClF_3/N_2$) at this time was 0.0193. In Case D, the flow rate of the $ClF_3$ gas was set to 26 sccm and the flow rate of the $N_2$ gas was set to 1,584 sccm. The partial pressure ratio ($ClF_3/N_2$) at this time was 0.0164.

As a result of the etching performed by changing the time to 60 sec, 120 sec, 150 sec, 180 sec, and 240 sec under the conditions of cases A to D, TiN could be etched without residue at the etching time of 120 sec or more in cases A to C and at the etching time of 150 sec or more in case D.

Figure 12:
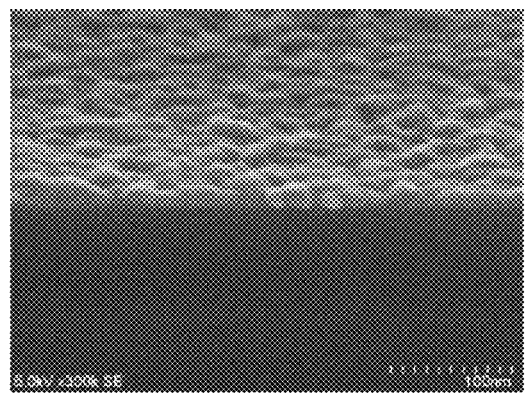
FIG. 12 is an SEM photograph of the surface of the Mo film when etched for 120 sec under a condition of Case A of Experimental Example 1.
Figure 13:
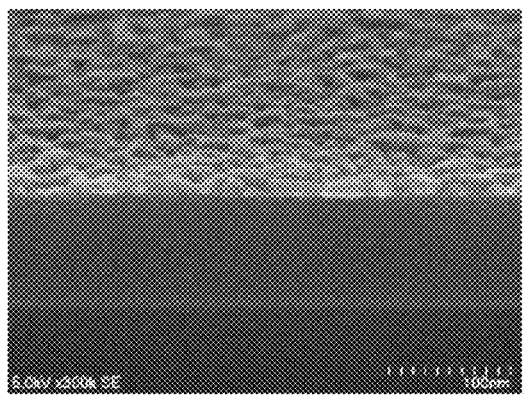
FIG. 13 is an SEM photograph of the surface of the Mo film when etched for 120 sec under a condition of Case B of Experimental Example 1.
Figure 14:
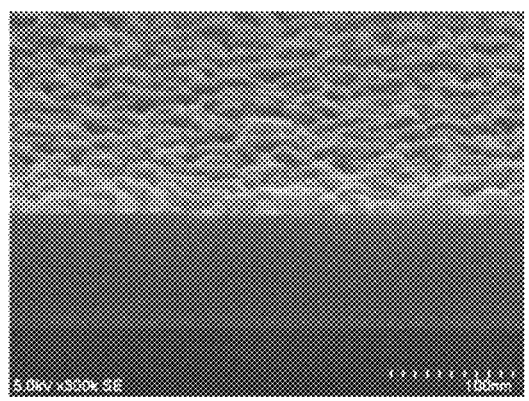
FIG. 14 is an SEM photograph of the surface of the Mo film when etched for 150 sec under a condition of Case C of Experimental Example 1.
Figure 15:
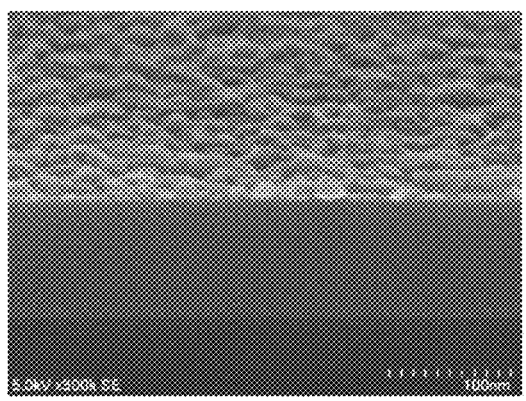
FIG. 15 is an SEM photograph of the surface of the Mo film when etched for 150 sec under a condition of Case D of Experimental Example 1.

The states of the Mo film when etched under the conditions of Cases A to D were as follows. In Case A in which the partial pressure ratio ($ClF_3/N_2$) exceeds 0.0512 and 0.026, a pitting was generated and the surface roughness was large at the etching time of 120 sec, as shown in the SEM photograph of FIG. 12 (RMS 2.45 nm). On the other hand, in Cases B to D in which the partial pressure ratio ($ClF_3/N_2$) is 0.026 or less, a good surface state was obtained without pitting being observed on the Mo film under the condition that TiN could be etched without residue. Specifically, under the condition of Case B, at the etching time of 120 sec, no pitting was observed on the Mo film, and the surface roughness RMS was 1.23 nm, as shown in the SEM photograph of FIG. 13. Under the condition of Case C, no pitting was observed on the Mo film at the etching times of 120 sec and 150 sec, and the surface roughness RMS was as small as 1.07 nm as shown in the SEM photograph of FIG. 14. Under the condition of Case D, at the etching time of 150 sec, as shown in the SEM photograph of FIG. 15, no pitting was observed on the Mo film, and the surface roughness RMS became a smaller value of 1.05 nm.

Experimental Example 2

Next, an experiment was conducted to confirm the mechanism of suppressing the generation of a pitting on the Mo film.

In this experiment, a substrate on which a Mo film is formed was prepared was subjected to DHF pretreatment. Then, a sample (sample 1) subjected to the DHF pretreatment, a sample (sample 2) subjected to nitriding treatment after DHF pretreatment, and a sample (sample 3) subjected to oxidizing treatment after DHF pretreatment were prepared. The nitriding treatment was carried out by heat treatment at 300 degrees C. for 1 hour in an $N_2$ gas atmosphere, and the oxidizing treatment was carried out by heat treatment at 300 degrees C. for 1 hour in an $O_2$ gas atmosphere. The surface roughness and the amount of etching by AMF were measured for these samples.

Subsequently, these samples were gas-treated with a gas including a $ClF_3$ gas and a $N_2$ gas. The gas treatment was carried out in a state in which the temperature of the substrate is 80 to 100 degrees C., the internal pressure of the chamber is 0.25 to 2 Torr (33.3 to 267 Pa), the flow rate of the $ClF_3$ gas is 23 sccm, and the flow rate of the $N_2$ gas is 1,187 sccm. The surface roughness and the amount of etching by AMF were measured for the samples after gas treatment.

Figure 16:
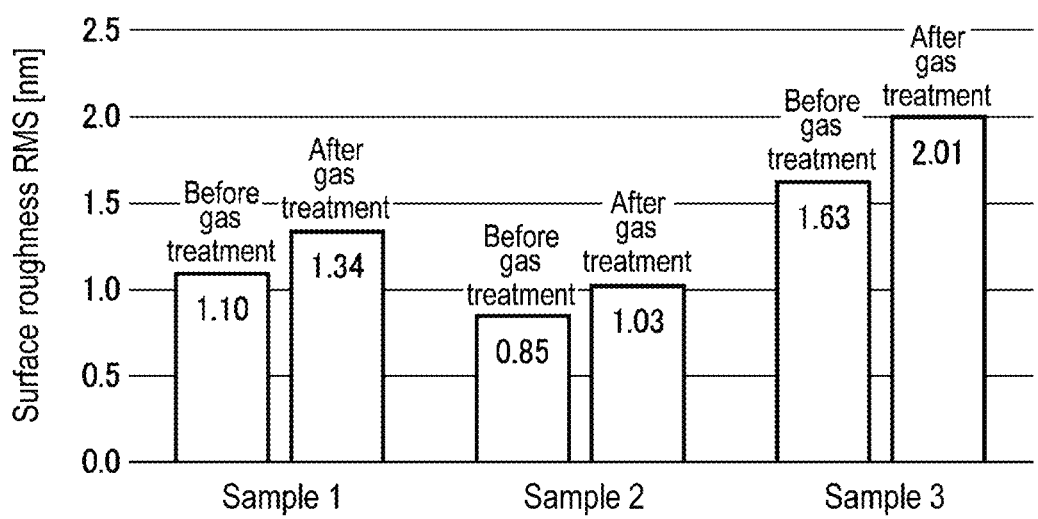
FIG. 16 is a diagram showing changes in surface roughness RMS of Samples 1 to 3 in Experimental Example 2 before and after gas treatment.
Figure 17:
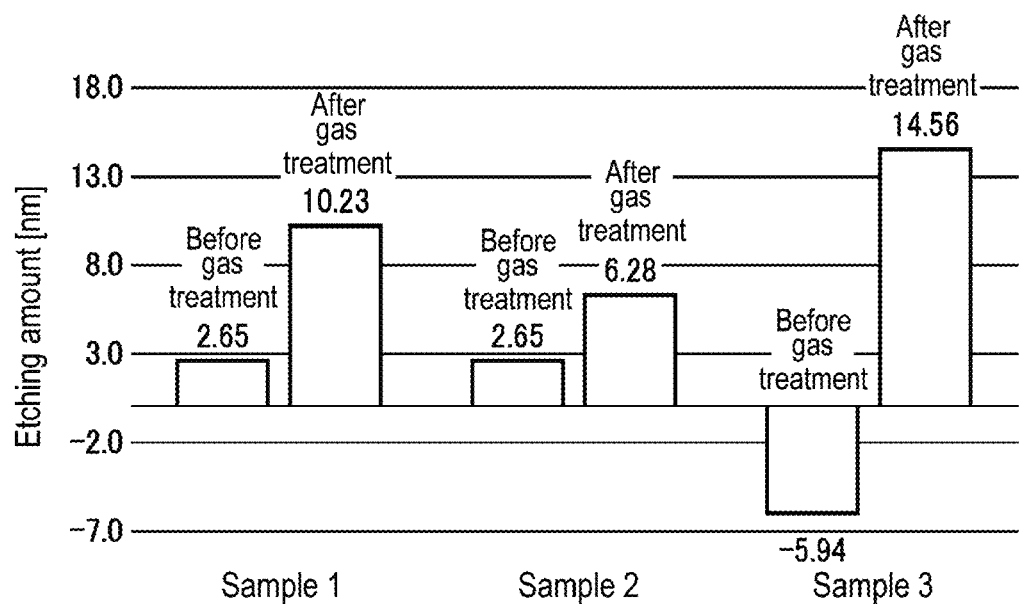
FIG. 17 is a diagram showing changes in etching amounts of Samples 1 to 3 in Experimental Example 2 before and after gas treatment.

Changes in the surface roughness RMS and changes in the etching amount for the samples 1 to 3 before and after the gas treatment are shown in FIGS. 16 and 17, respectively. As shown in FIG. 16, the RMS before the gas treatment was decreased in sample 2 subjected to the nitriding treatment and was increased in sample 3 subjected to the oxidizing treatment, as compared with sample 1 in which neither nitriding treatment nor oxidizing treatment was performed. Further, after the gas treatment, the RMS of each of samples 1 to 3 was increased, but the RMS increasing amount of sample 2 subjected to the nitriding treatment tended to be small, and the RMS increasing amount of sample 3 subjected to the oxidizing treatment tended to be large. As shown in FIG. 17, the etching amount before the gas treatment remains substantially the same in sample 1 which has not been subjected to both the nitriding treatment and the oxidizing treatment and sample 2 which has been subjected to the nitriding treatment. In sample 3 which has been subjected to the oxidizing treatment, the film was swollen and thickened due to oxidization. Further, the etching amount after the gas treatment was smaller in sample 2 subjected to the nitriding treatment than in sample 1 and was larger in sample 3 subjected to the oxidizing treatment than in sample 1.

Further, as a result of analyzing the composition of the film surface layer by XPS for sample 2 subjected to the nitriding treatment, the concentration of N in sample 2 was about 6 at % before the gas treatment and about 5 at % even after the gas treatment. Further, in sample 3 subjected to the oxidizing treatment, the concentration of O was about 70 at % before the gas treatment and about 35 at % even after the gas treatment. From these facts, it was confirmed that the surface layer of Mo was nitrided and oxidized by the nitriding treatment and the oxidizing treatment. As described above, it was confirmed that the Mo film is difficult to be etched when subjected to nitriding and is easily etched when subjected to oxidizing.

It can be said that these results confirm that when subjected to nitriding, the grain boundaries in the surface layer of the Mo film are difficult to be etched and a pitting is difficult to be generated.

OTHER APPLICATIONS

Although the embodiments have been described above, the embodiments disclosed herein should be considered to be exemplary and not limitative in all respects. The above embodiments may be omitted, replaced, or modified in various forms without departing from the scope of the appended claims and their gist.

For example, the structural example of the substrate shown in FIGS. 2 and 3 is nothing more than an example. The present disclosure may be applied to any substrate as long as the substrate is provided so that Mo or W can come into contact with a processing gas when TiN is etched. Further, the structure of the etching apparatus is nothing more than an example. Apparatuses having various configurations may be used as the etching apparatus. In addition, although there is illustrated the case in which the semiconductor wafer is used as the substrate, the present disclosure is not limited to the semiconductor wafer. The substrate may be other substrates such as an FPD (flat panel display) substrate represented by an LCD (liquid crystal display) substrate, a ceramic substrate, and the like.

According to the present disclosure in some embodiments, it is possible to provide an etching method and an etching apparatus which are capable of etching a titanium nitride film while suppressing a pitting from being generated in molybdenum or tungsten on a substrate in which titanium nitride and the molybdenum or the tungsten are present.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An etching method, comprising:
preparing a substrate in which titanium nitride and molybdenum or tungsten are present; and
etching the titanium nitride by supplying a processing gas including a $ClF_3$ gas and a $N_2$ gas to the substrate,
wherein in the etching the titanium nitride, a partial pressure ratio of the $ClF_3$ gas to the $N_2$ gas in the processing gas is set to a value at which grain boundaries of the molybdenum or the tungsten are nitrided to such an extent that generation of a pitting is suppressed.

2. The etching method of claim 1, wherein the partial pressure ratio ($ClF_3/N_2$) of the $ClF_3$ gas and the $N_2$ gas is set to 0.026 or less.

3. The etching method of claim 2, further comprising:
pretreating the substrate with a dilute hydrofluoric acid before the etching the titanium nitride.

4. The etching method of claim 3, wherein the substrate has a structure in which a molybdenum film and a silicon-containing film are stacked with an aluminum oxide film and a titanium nitride film interposed therebetween, and the molybdenum film is etched to expose the titanium nitride film before the etching the titanium nitride.

5. The etching method of claim 4, wherein a temperature in the etching the titanium nitride is 20 to 180 degrees C.

6. The etching method of claim 5, wherein a pressure in the etching the titanium nitride is 33.3 to 267 Pa.

7. The etching method of claim 1, further comprising:
pretreating the substrate with a dilute hydrofluoric acid before the etching the titanium nitride.

8. The etching method of claim 1, wherein the substrate has a structure in which a molybdenum film and a silicon-containing film are stacked with an aluminum oxide film and a titanium nitride film interposed therebetween, and the molybdenum film is etched to expose the titanium nitride film before the etching the titanium nitride.

9. The etching method of claim 1, wherein a temperature in the etching the titanium nitride is 20 to 180 degrees C.

10. The etching method of claim 1, wherein a pressure in the etching the titanium nitride is 33.3 to 267 Pa.

11. An etching method, comprising:
preparing a substrate in which titanium nitride and molybdenum or tungsten are present; and
etching the titanium nitride by supplying a processing gas including a $ClF_3$ gas and a $N_2$ gas to the substrate,
wherein in the etching the titanium nitride, a partial pressure ratio of the $ClF_3$ gas to the $N_2$ gas in the processing gas is set to 0.026 or less.

12. The etching method of claim 11, further comprising:
pretreating the substrate with a dilute hydrofluoric acid before the etching the titanium nitride.

13. The etching method of claim 12, wherein the substrate has a structure in which a molybdenum film and a silicon-containing film are stacked with an aluminum oxide film and a titanium nitride film interposed therebetween, and the molybdenum film is etched to expose the titanium nitride film before the etching the titanium nitride.

14. The etching method of claim 13, wherein a temperature in the etching the titanium nitride is 20 to 180 degrees C.

15. The etching method of claim 14, wherein a pressure in the etching the titanium nitride is 33.3 to 267 Pa.

16. The etching method of claim 11, wherein the substrate has a structure in which a molybdenum film and a silicon-containing film are stacked with an aluminum oxide film and a titanium nitride film interposed therebetween, and the molybdenum film is etched to expose the titanium nitride film before the etching the titanium nitride.

17. The etching method of claim 11, wherein a temperature in the etching the titanium nitride is 20 to 180 degrees C.

18. The etching method of claim 11, wherein a pressure in the etching the titanium nitride is 33.3 to 267 Pa.

19. An etching apparatus, comprising:
a chamber in which a substrate is accommodated;
a stage provided inside the chamber and configured to place the substrate thereon;
a gas supplier configured to supply a processing gas including a $ClF_3$ gas and a $N_2$ gas to an interior of the chamber;
an exhauster configured to exhaust the interior of the chamber;
a temperature controller configured to adjust a temperature of the substrate placed on the stage; and
a controller,
wherein the controller is configured to control the gas supplier, the exhauster, and the temperature controller so as to execute the etching method of claim 1.

20. An etching apparatus, comprising:
a chamber in which a substrate is accommodated;
a stage provided inside the chamber and configured to place the substrate thereon;
a gas supplier configured to supply a processing gas including a $ClF_3$ gas and a $N_2$ gas to an interior of the chamber;
an exhauster configured to exhaust the interior of the chamber;
a temperature controller configured to adjust a temperature of the substrate placed on the stage; and
a controller,
wherein the controller is configured to control the gas supplier, the exhauster, and the temperature controller so as to execute the etching method of claim 11.

* * * * *